US011296165B2

(12) United States Patent
Zhang et al.

(10) Patent No.: US 11,296,165 B2
(45) Date of Patent: Apr. 5, 2022

(54) ARRAY SUBSTRATE, DISPLAY APPARATUS, AND METHOD OF FABRICATING ARRAY SUBSTRATE

(71) Applicant: BOE Technology Group Co., Ltd., Beijing (CN)

(72) Inventors: Feng Zhang, Beijing (CN); Zhijun Lv, Beijing (CN); Wenqu Liu, Beijing (CN); Liwen Dong, Beijing (CN); Xiaoxin Song, Beijing (CN); Zhao Cui, Beijing (CN); Detian Meng, Beijing (CN); Libo Wang, Beijing (CN); Chuanxiang Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 221 days.

(21) Appl. No.: 16/755,643

(22) PCT Filed: May 20, 2019

(86) PCT No.: PCT/CN2019/087610
§ 371 (c)(1),
(2) Date: Apr. 13, 2020

(87) PCT Pub. No.: WO2020/232598
PCT Pub. Date: Nov. 26, 2020

(65) Prior Publication Data
US 2022/0037433 A1  Feb. 3, 2022

(51) Int. Cl.
*H01L 27/32* (2006.01)
*H01L 51/00* (2006.01)
*H01L 51/56* (2006.01)

(52) U.S. Cl.
CPC ...... *H01L 27/3258* (2013.01); *H01L 27/3276* (2013.01); *H01L 51/0097* (2013.01);
(Continued)

(58) Field of Classification Search
None
See application file for complete search history.

(56) References Cited

U.S. PATENT DOCUMENTS

2018/0226613 A1  8/2018 Kang et al.
2018/0287080 A1  10/2018 Wang et al.
(Continued)

FOREIGN PATENT DOCUMENTS

CN  106206945 A  12/2016
CN  107768406 A   3/2018
(Continued)

OTHER PUBLICATIONS

International Search Report & Written Opinion dated Feb. 26, 2020, regarding PCT/CN2019/087610.

*Primary Examiner* — J. E. Schoenholtz
(74) *Attorney, Agent, or Firm* — Intellectual Valley Law, P.C.

(57) ABSTRACT

An array substrate includes a flexible base substrate; a buffer layer on the flexible base substrate and continuously extending from a display area into a peripheral area, including a first portion substantially extending throughout the display area and a second portion in the peripheral area, the first portion and the second portion being parts of an integral layer, an organic insulating layer substantially extending throughout but limited in the display area and on a side of the buffer layer away from the flexible base substrate; an inorganic insulating layer limited in the peripheral area and on a side of the buffer layer away from the flexible base substrate; a planarization layer on a side of the organic insulating layer away from the buffer layer, and a plurality of light emitting elements on a side of the planarization layer away from the organic insulating layer.

20 Claims, 6 Drawing Sheets

(52) U.S. Cl.
CPC ........ *H01L 51/56* (2013.01); *H01L 2227/323* (2013.01); *H01L 2251/5338* (2013.01)

(56) References Cited

U.S. PATENT DOCUMENTS

2019/0179449 A1\* 6/2019 Cho ..................... H01L 27/323
2019/0214412 A1   7/2019 Yuan et al.

FOREIGN PATENT DOCUMENTS

| | | |
|---|---|---|
| CN | 108962026 A | 12/2018 |
| CN | 109427249 A | 3/2019 |
| KR | 20180036853 A | 4/2018 |

\* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2019/087610, filed May 20, 2019, the contents of which are incorporated by reference in the entirety.

TECHNICAL FIELD

The present invention relates to display technology, more particularly, to an array substrate, a display apparatus, and a method of fabricating an array substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than typical LCD apparatuses.

SUMMARY

In one aspect, the present invention provides an array substrate having a display area and a peripheral area, comprising a flexible base substrate: a buffer layer on the flexible base substrate and continuously extending from live display area into the peripheral area, comprising a first portion substantially extending throughout the display area and a second portion in the peripheral area, the first portion and the second portion being parts of an integral layer; an organic insulating layer substantially extending throughout but limited in the display area and on a side of the buffer layer away from the flexible base substrate: air inorganic insulating layer limited in the peripheral area and on a side of the buffer layer away from the flexible base substrate; a planarization layer on a side of the organic insulating layer away From the buffer layer and a plurality of light emitting elements on a side of the planarization layer away from the organic insulating layer.

Optionally, the array substrate further comprises a plurality of thin film transistors on the flexible base substrate; wherein a respective one of the plurality of thin film transistors comprises a gate electrode, an active layer, a source electrode, and a drain electrode; and the buffer layer is on a side of the gate elect rode and the active layer away from the flexible base substrate.

Optionally, the source electrode and the drain electrode are on a side of the organic insulating layer away from the flexible base substrate; the source electrode extends through the organic insulating layer and the buffer layer to electrically connect with the active layer; and the drain electrode extends through the organic insulating layer and the buffer layer to electrically connect, with the active layer.

Optionally, the array substrate further comprises a plurality of first signal lines in the peripheral area and on a side of the inorganic insulating layer away from the flexible base substrate; wherein the plurality of first signal lines, the source electrode, and the drain electrode; are in a same layer and comprise a same material.

Optionally, the array substrate further comprises a plurality of second signal lines in the peripheral area and on a side of the buffer layer closer to the flexible base substrate; wherein the plurality of second signal lines and the gate electrode are in a same layer and comprise a same material; and the plurality of first signal lines are insulated from the plurality of second signal tines by the inorganic insulating layer and the buffer layer.

Optionally, the source electrode is in direct contact with the organic insulating layer; the drain electrode is in direct contact with the organic insulating layer; and the plurality of first signal lines are in direct contact with the inorganic insulating layer.

Optionally, the first portion has a thickness less than a thickness of the second portion.

Optionally, the organic insulating layer is in direct contact with the buffer layer; and the inorganic insulating layer is in direct contact with the buffer layer.

Optionally, the buffer layer comprises silicon oxide ($SiO_x$, $0 < x \leq 2$); and the inorganic insulating layer comprises silicon nitride ($SiN_y$, $0 < y \leq 4/3$).

In another aspect, the present invention provides a display apparatus, comprising the array substrate described herein or fabricated by a method described herein, and one or more integrated circuits connected to the array substrate.

In another aspect, the present invention provides a method of fabricating an array substrate having a display area and a peripheral area, comprising forming a buffer layer on a flexible base substrate and continuously extending from the display area into the peripheral area, the buffer layer being formed as an integral layer comprising a first portion substantially extending throughout the display area and a second portion in the peripheral area; forming an organic insulating layer substantially extending throughout the display area and on a side of the buffer layer away front the flexible base substrate, the organic insulating layer being formed to be limited in the display area: forming an inorganic insulating layer on a side of the butter layer away from the flexible base substrate, the inorganic insulating layer being formed to be limited in the peripheral area; forming a planarization layer on a side of the organic insulating layer away from the buffer layer; and forming a plurality of light emitting elements on a side of the planarization layer away from the organic insulating layer.

Optionally, forming the buffer layer comprises forming a buffer material layer on the flexible base substrate and continuously extending from the display area into the peripheral area; forming an inorganic insulating material layer on a side of the buffer material layer away from the flexible base substrate and continuously extending from the display area into the peripheral area; and annealing the buffer material layer and the inorganic insulating material layer.

Optionally, subsequent to annealing the buffer material layer and the inorganic insulating material layer, the method further comprises removing the inorganic insulating material layer in the display area while maintaining the inorganic insulating material layer in the peripheral area thereby forming the inorganic insulating layer in the peripheral area; and reducing a thickness of the buffer material layer in the display area, thereby forming the buffer layer comprising the first portion substantially extending throughout the display area and the second portion in the peripheral area; wherein the first portion has a thickness less than a thickness of the second portion; and removing the inorganic insulating material layer in the display area and reducing the thickness of the buffer material layer in the display area are performed in a same patterning process using a same etchant.

Optionally, prior to forming the buffer layer, the organic insulating layer, and the inorganic insulating layer, the method further comprises forming a plurality of thin film transistors on the flexible base substrate, wherein a respective one of the plurality of thin film transistors is formed to comprise a gate electrode, an active layer, a source electrode, and a drain electrode; and the buffer layer is formed on a side of the gate electrode and the active layer away from the flexible base substrate.

Optionally, subsequent to forming the buffer layer and the inorganic insulating layer, the method further comprises forming an organic insulating material layer on a side of the buffer layer and the inorganic insulating layer away from the flexible base substrate; and patterning the organic insulating material layer to remove a portion of the organic insulating material layer in the peripheral area and forming a first via and a second via extending through the organic imitating material layer in the display area, thereby forming the organic insulating layer in flic display area.

Optionally, subsequent to forming the organic insulating layer in the display area, the method further comprises forming a protective layer in the peripheral area to protect the inorganic insulating layer and the buffer layer in the peripheral area: and etching the buffer layer and a gate insulating layer underneath the first via and the second via respectively to expose a source electrode contact region and a drain electrode contact region of the active layer.

Optionally, the method further comprises removing the protective layer in the peripheral area; and cleaning the source electrode contact region and the drain electrode contact region using a cleansing agent.

Optionally, the cleansing agent comprises hydrogen fluoride.

Optionally, the method further comprises forming a source electrode and a drain electrode on a side of the organic insulating layer away from the flexible base substrate, the source electrode extending through the first via to connect to the source electrode contact region, the drain electrode extending through the second via to connect to the drain electrode contact region.

Optionally, the method further comprises forming a plurality of first signal lines in the peripheral area and on a side of the inorganic insulating layer away from the flexible base substrate; and forming a plurality of second signal lines in the peripheral area and on a side of the buffet layer closer to the flexible base substrate; wherein the plurality of first signal lines, the source electrode, said the drain electrode are formed in a same layer using a same material in a same patterning process using a same mask plate; and the plurality of second signal lines and the gale electrode are formed in a same layer using a same material in a same patterning process using a same mask plate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a flexible display panel, art organic insulating material may be used in the display area to replace an inorganic insulating layer. It is discovered in the present disclosure that external oxygen and moist may permeate through the organic insulating layer, thus deteriorating the light emitting elements in the display panel.

Accordingly, the present disclosure provides, inter alia, an array substrate, a display apparatus, and a method of fabricating tut array substrate that substantially obviate one or more of the problems due to limitations and disadvantages of the related art. In one aspect, the present disclosure provides an array substrate having a display area and a peripheral area. In some embodiments, the array substrate includes a flexible base substrate: a buffer layer on the flexible base substrate and continuously extending from the display area into the peripheral area, including a first portion substantially extending throughout the display area and a second portion in the peripheral area, the first portion and the second portion being parts of an integral layer, an organic insulating layer substantially extending throughout hut limited in the display area and on a side of the buffer layer away from the flexible base substrate: an inorganic insulating layer limited in the peripheral area and on a side of the buffer layer away from the flexible base substrate: a planarization layer on a side of the organic insulating layer away from the buffer layer; and a plurality of light emitting elements on aside of the planarization layer away from the organic insulating layer.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between, adjacent subpixel regions, such as a region corresponding to a black matrix in a liquid crystal display or a region corresponding a pixel definition layer in an organic light emitting crystal display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

Figure 1:
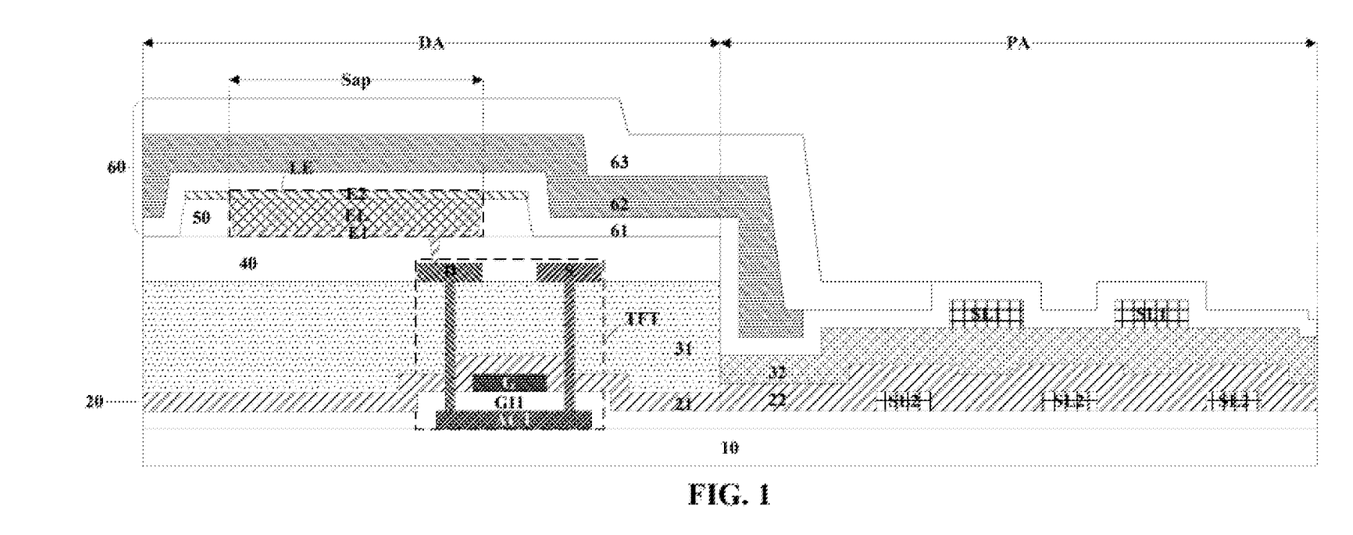
FIG. 1 is a cross-sectional view of an array substrate in some embodiments according to the present disclosure.

FIG. 1 is a cross-sectional view of an array substrate in some embodiments according to the present disclosure. Referring to FIG. 1, the array substrate has a display area DA and a peripheral area PA. The array substrate includes a plurality of light emitting LE in the display area DA. In some embodiments, the array substrate includes a flexible base substrate 10, a buffer layer 20 on the flexible base substrate 10 and continuously extending from the display area DA into the peripheral area PA; an organic insulating layer 31 substantially extending throughout but limited in the display area DA and on a side of the buffer layer 20 away from the flexible base substrate 10; an inorganic insulating layer 32 limited in the peripheral area PA and on a side of the buffer layer 20 away from the flexible base substrate 10; a planarization layer 40 on a side of the organic insulating layer 31 away from the buffer layer 20; and a plurality of light emitting elements LE on a side of the planarization layer 40 away from the organic insulating layer 31. Optionally, the buffer layer 20 includes a first portion 23 substantially extending throughout the display area DA and a second portion 22 in the peripheral area PA, the first portion 21 and the second portion 22 being parts of an integral layer, e.g., the first portion 21 and the second portion 22 constitute a unitary layer extending throughout the display area DA and the peripheral area PA. The first portion 21 is substantially limited in the display area DA, and the second portion 22 is substantially limited in the peripheral area PA. The organic insulating layer 31 includes an organic insulating material, and the inorganic insulating layer 32 includes an inorganic insulating material.

Various appropriate light emitting elements may be used in the present display substrate. Examples of appropriate light emitting elements include organic light emitting diodes, quantum dots light emitting diodes, and micro light emitting diodes.

In some embodiments, the array substrate further includes a plurality of thin film transistors TFT on the flexible base substrate 10. A respective one of the plurality of thin film transistors TFT includes an active layer ACT, a gate insulating layer GI1 on the active layer ACT, a gate electrode G on a side of the gate insulating layer GI1 away from the active layer ACT, a source electrode S and a drain electrode D respectively connected to the active layer ACT.

A respective one of the plurality of light emitting elements LE in some embodiments includes a first electrode E1, a light emitting layer EL on the first electrode E1, and a second electrode E2 on a side of five light emitting layer EL away from the first electrode E1. The first electrode E1 extends through live planarization layer 40 to electrically connected to the drain electrode D of a respective one of the plurality of thin film transistors TFT. Optionally, the array substrate further Includes a pixel definition layer 50 for defining a plurality of subpixel apertures Sap, a respective one of which receiving the light emitting layer EL.

Referring to FIG. 1, in some embodiments, the buffer layer 20 is on a side of the gate electrode G and the active layer ACT away from the flexible base substrate 10. Optionally, five buffer layer 20 is in direct contact with the organic insulating layer 31 in the display area DA, and is in direct contact with the inorganic insulating layer 32 in the peripheral area PA.

Referring to FIG. 1, in some embodiments, the source electrode S and the drain electrode D are on a side of the organic insulating layer 31 away from the flexible base substrate 10. Optionally, the source electrode S and the drain electrode D are between the organic insulating layer 31 and the planarization layer 40. For example, each of the source electrode S and the drain electrode D is in direct contact with the organic insulating layer 31 and in direct contact with the planarization layer 40. The source electrode S extends through the organic insulating layer 31 and the first portion 21 of the buffer layer 20 to electrically connect with the active layer ACT. The drain electrode D extends through the organic insulating layer 31 and the first portion 21 of the butter layer 20 to electrically connect with the active layer ACT.

Various appropriate insulating materials and various appropriate fabricating methods may be used to make the organic insulating layer 31. For example, an insulating material may be deposited on the substrate by a plasma-enhanced chemical vapor deposition (PECVD) process and patterned. Examples of appropriate organic insulating materials for making the organic insulating layer 31 include polyimide and phenolic resin.

Various appropriate insulating materials and various appropriate fabricating methods may be used to make the inorganic insulating layer 32. For example, an insulating material may be deposited on the substrate by a plasma-enhanced chemical vapor deposition (PECVD) process and patterned Examples of inorganic insulating materials suitable for making the inorganic insulating layer 32 include silicon oxide ($SiO_x$), silicon nitride ($SiN_y$, e.g., $Si_3N_4$), and silicon oxynitride ($SiO_xN_y$). Optionally, the thickness of the inorganic insulating layer 32 is in the range of about 1000 Å to about 3000 Å, e.g., about 1000 Å to about 1500 Å, about 1500 Å to about 2000 Å, about 2000 Å to about 2500 Å, or about 2500 Å about 3000 Å.

Various appropriate insulating materials and various appropriate fabricating methods may be used to make the buffer layer 20. For example, an insulating material may be deposited on the substrate by a plasma-enhanced chemical vapor deposition (PECVD) process and patterned. Examples of appropriate insulating materials for making the buffer layer 20 include, but are not limited to silicon oxide ($SiO_x$), silicon nitride ($SiN_y$, e.g., $Si_3N_4$), and silken oxynitride ($SiO_xX_y$). Optionally, the thickness of the buffer layer 20 is in the range of about 500 Å to about 2000 Å, e.g., about 500 Å to about 1000 Å, about 1000 Å to about 1500 Å, or about 1500 Å to about 2000 Å.

Optionally, the buffer layer 20 (including the first portion 21 and the second portion 22) are made of silicon oxide ($SiO_x$), and the inorganic insulating layer 32 is made of silicon nitride ($SiN_y$).

Various appropriate elastomer polymer materials may be used for making the flexible base substrate 10. Examples of appropriate elastomer polymers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polycaprolactone, and any combination thereof.

In some embodiments, the array substrate further includes a plurality of first signal lines SL1 in the peripheral area PA and on a side of the inorganic insulating layer 32 away from the flexible base substrate 10. Optionally, the plurality of first signal lines SL1, the source electrode S, and the drain electrode D are in a same layer and are made of a same material in a same patterning process using a same mask plate. Optionally, the plurality of first signal lines SL1 include a plurality of data line signal lead lines. One terminal of a respective one of the plurality of data fine signal lead fines in the peripheral area PA is connected to a respective one of plurality of data lines in the display urea DA, and optionally, another terminal of the respective one of the plurality of data fine signal lead tines in the peripheral area PA is electrically connected to an integrated circuit.

In some embodiments, the array substrate further includes a plurality of second signal lines SL2 in the peripheral area PA and on a side of the buffer layer 20 closer to the flexible base substrate 10. Optionally, the plurality of second signal fines SL2 and the gate electrode G are in a same layer and are made of a same material in a same patterning process using a same mask plate. Optionally, the plurality of second signal lines SL2 include a plurality of gate line signal lead lines. One terminal of a respective one of the plurality of gate line signal lead lines in the peripheral area PA is connected to a respective one of a plurality of gate lines in the display area DA, and optionally, another terminal of the respective one of the plurality of gate line signal lead lines in the peripheral area PA is electrically connected to an integrated circuit.

Optionally, the plurality of first signal lines SL1 are insulated from the plurality of second signal lines SL2 by the inorganic insulating layer 32 and the second portion 22 of the buffer layer 20. Optionally, the plurality of first signal lines SL1 are in direct contact wish the inorganic insulating layer 32.

Figure 2:
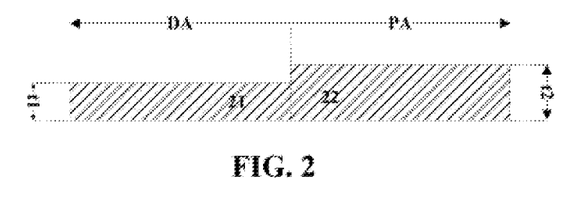
FIG. 2 illustrates an interlace between an organic insulating layer and an inorganic insulating layer in an array substrate in some embodiments according to the present disclosure.

In some embodiments, the first portion 21 has a thickness less than a thickness of the second port ion 22. FIG. 2 illustrates an interface between an organic insulating layer and an inorganic insulating layer in an array substrate in some embodiments according to the present disclosure. Referring to FIG. 2, in some embodiments, the first portion 21 has a first thickness t1, and the second portion 22 has a second thickness t2. Optionally, t2>t1. By having a thinner first portion 21 in the display area DA, the array substrate can be made more flexible or foldable. By maintaining the first portion 21 in the display area between the organic insulating layer 31 and the active layer ACT, characteristics and performance of the thin film transistor TFT can be stabilized. Optionally, t1 is in the range of about 500 Å to about 1000 Å, and t2 is in the range of about 500 Å to about 2000 Å. Optionally, a ratio of t2 to t1 is in the range of 3:1 to 3:2. e.g., 2:1.

Figure 3:
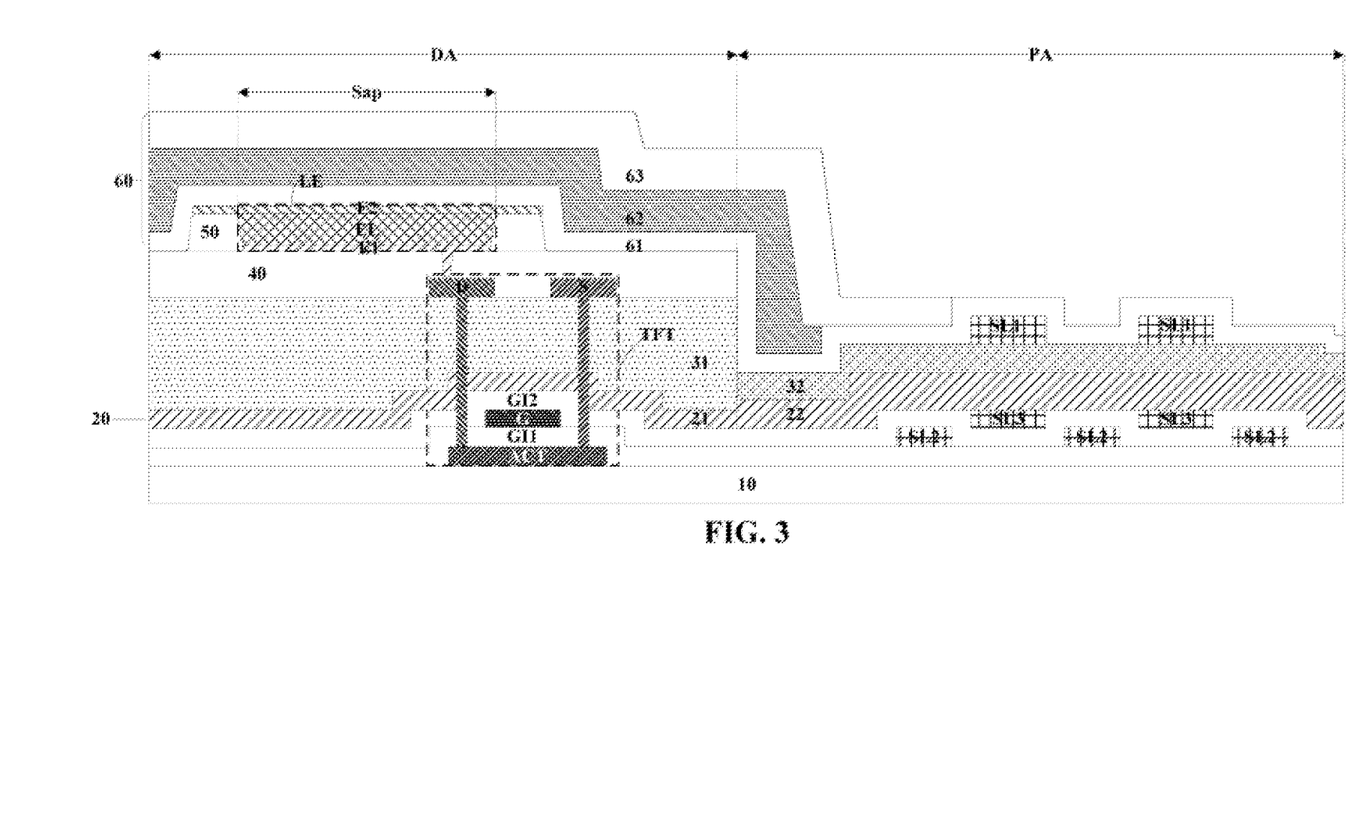
FIG. 3 is a cross-sectional view of an array substrate in some embodiments according to the present disclosure.

FIG. 3 is a cross-sectional view of an array substrate in some embodiments according to the present disclosure. Referring to FIG. 3, in some embodiments, the array substrate further includes a second gate insulating layer GI2 on a side of the gate electrode G away from the flexible base substrate 10, and between the gate electrode G and the buffer layer 20. Optionally, the second gate insulating layer GI2 is in direct contact with the organic insulating layer 31 in the display area DA, and is in direct contact with the inorganic insulating layer 32 in the peripheral area PA.

In some embodiments; the array substrate further includes a plurality of third signal lines SL3 in the peripheral area PA and between the gate insulating layer GI1 and the second gate insulating layer GI2. Optionally, the array substrate further includes a capacitor electrode in the display area DA and between the gate insulating layer GI1 and the second gate insulating layer GI2. Optionally, the plurality of third signal lines SL3 and the capacitor electrode are in a same layer and are made of a same material in a same patterning process using a same mask plate.

Referring to FIG. 1 and FIG. 3, the array substrate in some embodiments further includes an encapsulating layer 60 to encapsulate the plurality of light emitting elements LE. Optionally, the encapsulating layer 60 includes a first inorganic encapsulating sub-layer 61, an organic encapsulating sub-layer 62 on a side of the first inorganic encapsulating sub-layer 61 away from the flexible base substrate 10, and a second inorganic encapsulating sub-layer 63 on aside of the organic encapsulating sub-layer 62 away from the flexible base substrate 10. Optionally, the encapsulating layer 60 encapsulates both the display area DA and the peripheral area PA. Optionally, the encapsulating layer 60 encapsulates lateral side of the organic insulating layer 31, preventing external oxygen and moist from entering the array substrate through the lateral side of the organic insulating layer 31. Optionally, the encapsulating layer 60 encapsulates the plurality of first signal lines SL1 in the peripheral area PA. Optionally, in a region directly adjacent to an interface between the display area DA and the peripheral area PA, the planarization layer 40 is absent, and the encapsulating layer 60 fills in the space above the organic insulating layer 31.

In another aspect, the present disclosure provides a method of fabricating an array substrate having u display area and a peripheral area. In some embodiments, the method includes forming a buffer layer on a flexible base substrate and continuously extending from the display area into the peripheral area: forming an organic insulating layer substantially extending throughout the display area and on a side of the buffer layer away from the flexible base substrate, the organic insulating layer being formed to be limited in the display area; forming an inorganic insulating layer on a side of the buffer layer away from the flexible base substrate, the inorganic insulating layer being formed to be limited in the peripheral area; forming a planarization layer on a side of the organic insulating layer away from the buffer layer; and forming a plurality of light emitting elements on a side of the planarization layer away from the organic insulating layer. Optionally, the buffer layer is formed as an integral layer (e.g., a unitary layer) including a first portion substantially extending throughout the display area and a second portion in the peripheral area.

In some embodiments, the step of forming the buffer layer includes forming a buffer material layer on the flexible base substrate and continuously extending from the display area into the peripheral area; forming, an inorganic insulating material layer on a side of the buffer material layer away from the flexible base substrate and continuously extending from the display area into the peripheral area; and annealing the buffer material layer and the inorganic insulating material layer.

In some embodiments, subsequent to annealing the buffer material layer and the inorganic insulating material layer, the method further includes removing the inorganic insulating material layer in the display area while maintaining the inorganic insulating material layer in the peripheral area thereby forming the inorganic insulating layer in the peripheral area; and reducing a thickness of the buffer material layer in the display area, thereby forming the buffer layer comprising the first portion substantially extending throughout the display area and the second portion in the peripheral area. Optionally, the first portion has a thickness less titan a thickness of the second portion. Optionally, removing the inorganic insulating material layer in the display area and reducing the thickness of the butter material layer in the display area are performed in a same patterning process using a same etchant.

In some embodiments, prior to forming the buffer layer, the organic insulating layer, and the inorganic insulating layer, the method further includes forming a plurality of thin film transistors on the flexible base substrate. Optionally, a respective one of the plurality of thin film transistors is formed to include a gate electrode, an active layer, a source electrode, and a drain electrode. Optionally, the buffer layer is formed on a side of the gate electrode and the active layer away from the flexible base substrate.

In some embodiments, subsequent to forming the buffer layer and the inorganic insulating layer, the method further includes forming an organic insulating material layer on a side of the buffer layer and the inorganic insulating layer away from the flexible base substrate; and patterning the organic insulating material layer to remove a portion of the organic insulating material layer in the peripheral area and forming a first via and a second via extending through the organic insulating material layer in the display area, thereby forming the organic insulating layer in the display area.

In some embodiments, subsequent to forming the organic insulating layer in the display area, the method further includes forming a protective layer in the peripheral area to protect the inorganic insulating layer and the buffer layer in the peripheral area; and etching the buffer layer and a gate insulating layer underneath the first via and the second via respectively to expose a source electrode contact region and a drain electrode contact region of the active layer. Optionally, the method further includes removing the protective layer in the peripheral area; and cleaning the source electrode contact region and the drain electrode contact region using a cleansing agent. Optionally, the cleansing agent comprises hydrogen fluoride.

In some embodiment the method farther includes forming a source electrode and a drain electrode on a side of the organic insulating layer away from the flexible base substrate, the source electrode extending through the first via to connect to the source electrode contact region, the drain electrode extending through the second via to connect to the drain electrode contact region.

In some embodiments, the method further includes forming a plurality of first signal lines in the peripheral area and on a side of the inorganic insulating layer away from the flexible base substrate; and forming a plurality of second signal lines in the peripheral area and on a side of the buffer layer closer to the flexible base substrate. Optionally, the plurality of first signal lines, the source electrode, and the drain electrode are formed in a same layer using a same material in a same patterning process using a same mask plate. Optionally, the plurality of second signal tines and the gate electrode are formed in a same layer using a same material in a same patterning process using a same mask plate.

Figure 4A:
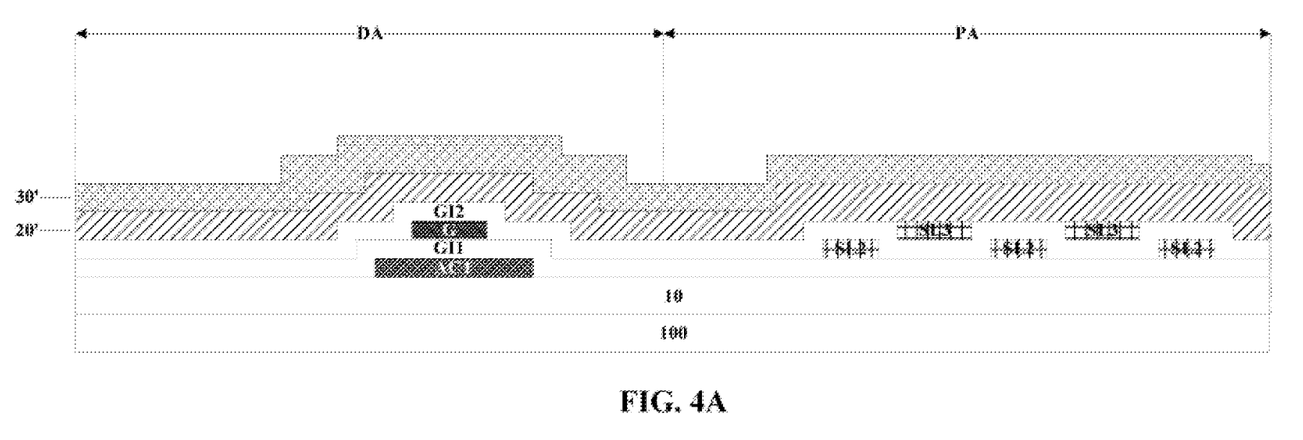
FIGS. 4A to 4G illustrate a method of fabricating an array substrate in some embodiments according to the present disclosure.

FIGS. 4A to 4G illustrate a method of fabricating an army substrate in some embodiments according to the present disclosure. Referring to FIG. 4A, a flexible base substrate 10 (e.g., a polyimide substrate) is formed on a support substrate 100 (e.g., a glass support), an active layer ACT is formed on a side of the flexible base substrate 10 away from the support substrate 100, a gate insulating layer GI1 is formed on a side of the active layer ACT away from the flexible base substrate 10, a gate electrode G and a plurality of second signal lines SL2 are formed in a same layer using a same material in a same patterning process using a same mask plate, and on a side of the gate insulating layer GI1 away from the flexible base substrate 10, a second gate insulating layer GI2 is formed on a side of the gate electrode G and the plurality of second signal lines SL2 away from the flexible hast substrate 10, a buffer material layer 20' is funned on a side of the second gate insulating layer GI2 away from the flexible base substrate 10, and an inorganic insulating material layer 30' is formed on a side of the buffer material layer 20' away from the flexible base substrate 10. The buffer material layer 20' is formed to extend from the display area DA to the peripheral area PA. The inorganic insulating material layer 20' is formed to extend from the display area DA to the peripheral area PA. Optionally, the barter material layer 20' is formed using silicon oxide ($SiO_x$, $0<x\leq2$); and the inorganic insulating material layer 30' is formed using silicon nitride ($SiN_y$, $0<y\leq4/3$). Optionally, the buffer material layer 20' is formed to have a thickness in the range of about 500 Å to about 2000 Å, e.g., about 500 Å to about 1000 Å, about 1000 Å to about 1500 Å, or about 1500 Å, to about 2000 Å. Optionally, the inorganic insulating material layer 30' is funned to have a thickness in the range of about 1000 Å to about 3000 Å. e.g., about 1000 Å to about 1500 Å, about 1500 Å to about 2000 Å, about 2000 Å to about 2500 Å, or about 2500 Å to about 3000 Å.

Subsequent to forming the buffer material layer 20' (e.g., subsequent to forming the buffer material layer 20' and the inorganic insulating material layer 30'), an annealing process is performed. In one example, the annealing treatment is performed at an annealing temperature of 450 Celsius degrees for an annealing duration of about 90 minutes.

Figure 4B:
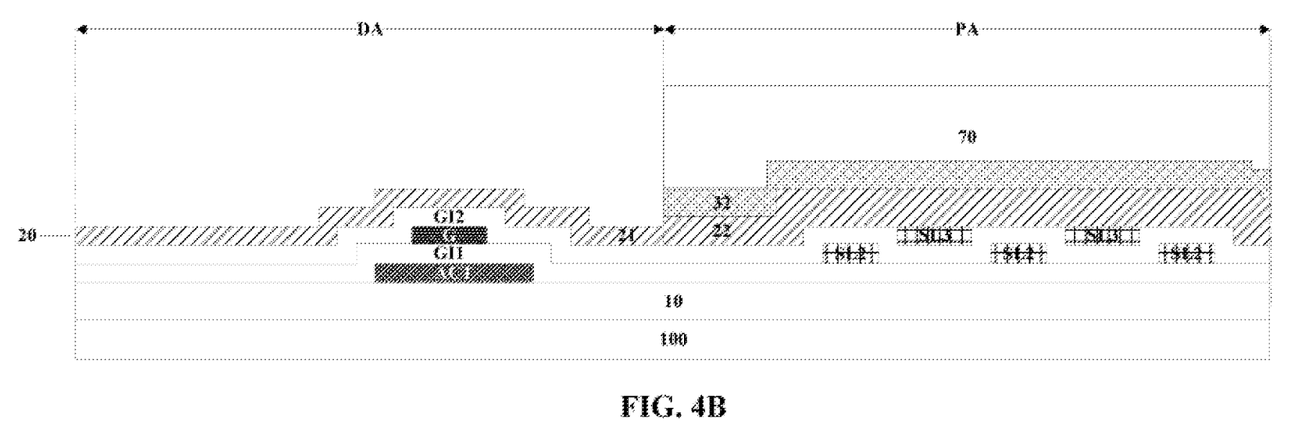

Referring to FIG. 4B, a first photoresist layer 70 is formed in the peripheral area PA to protect layers in this area. In the display area DA, an etching process is performed to remove the inorganic insulating material layer in the display area DA completely, thereby forming the inorganic insulating layer 32 in the peripheral area PA. Optionally, the buffer material layer in the display area DA is over-etched to reduce the thickness of the buffer material layer in the display area DA, thereby forming a buffer layer 20 including a first portion 21 in the display area DA and a second portion 22 in the peripheral area PA. Optionally, the first portion 21 has a thickness less than a thickness of the second portion 22, Optionally, the first portion 21 has a first thickness t1, and the second portion 22 has a second thickness t2. Optionally, t2>t1. Optionally, t1 is in the range of about 500 Å to about 1000 Å, and t2 is in the range of about 500 Å to about 2000 Å. Optionally, a ratio of t2 to t1 is in the range of 3:1 to 3:2, e.g., 2:1

Figure 4C:
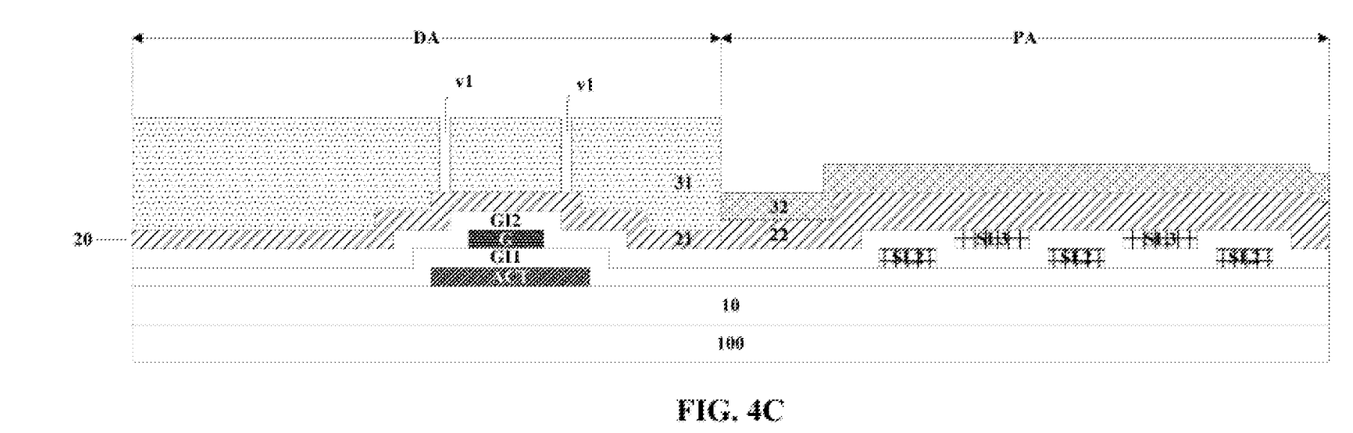

Referring to FIG. 4C, an organic insulating layer 31 is formed in the display area DA, and the first photoresist layer 70 in the peripheral area PA is removed. A plurality of first vias v1 are formed to extend through the organic insulating layer 31, thereby exposing a surface of the first portion 21 of the barter layer 20. The organic insulating layer 31 is cured, e.g., by baking.

Figure 4D:
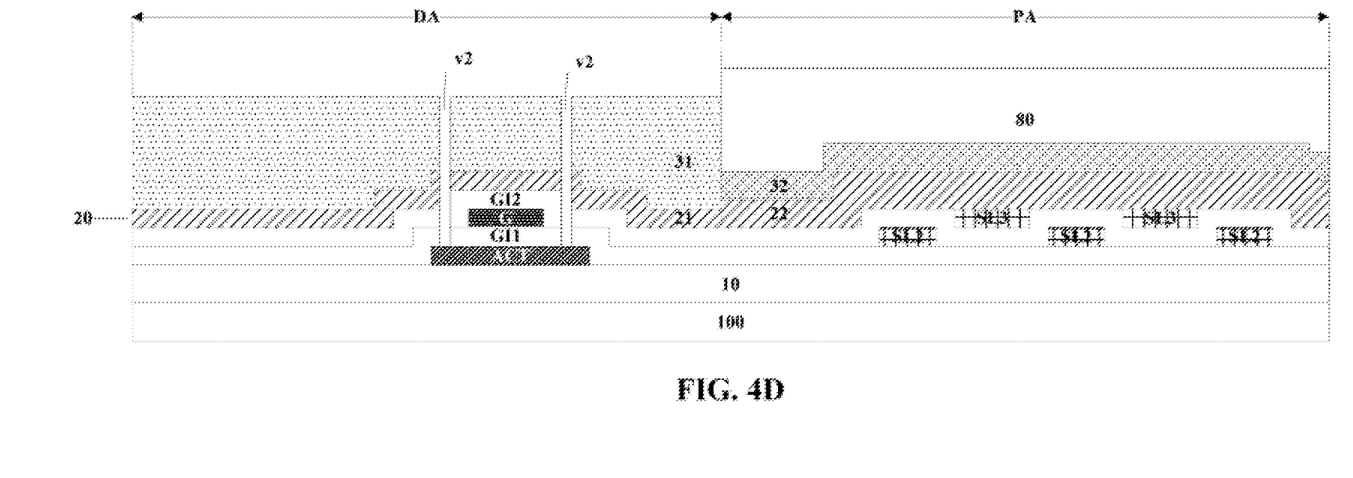

Referring to FIG. 40, a second photoresist layer 80 is formed to protect the peripheral area PA, e.g., to protect the second portion 22 of the buffer layer and the inorganic insulating layer 32 in the peripheral area PA. The first portion 21 of the buffer layer 29, the second gale insulating layer GI2 and the gate insulating layer GI1 are etched through the surface of the first portion exposed by the plurality of first vias v1. Etching the first portion 21 of the buffer layer 20, the second gate insulating layer GI2 and the gate insulating layer GI1 results in a plurality of second vias v2, extending through the first portion 21 of the butter layer 20, the second gate insulating layer GI2, and the gate insulating layer GI1, exposing a surface of the active layer ACT.

Figure 4E:
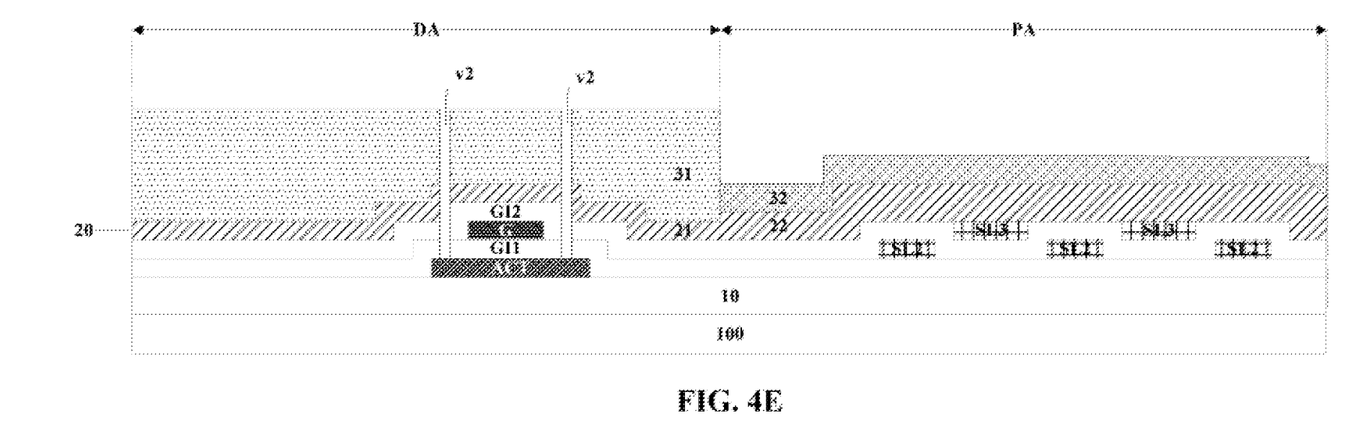

Referring to FIG. 4E, subsequently, the second photoresist layer 80 is removed The exposed surface of the active layer ACT is cleaned using a cleaning agent such as a hydrogen fluoride-containing cleaning agent. By cleaning the exposed surface of the active layer ACT, e.g., by removing the surface oxide of an active layer made of polysilicon, an excellent Ohmic contact between the active layer ACT and the source electrode and the drain electrode to be formed in the plurality of second vias v2 can be ensured.

Figure 4F:
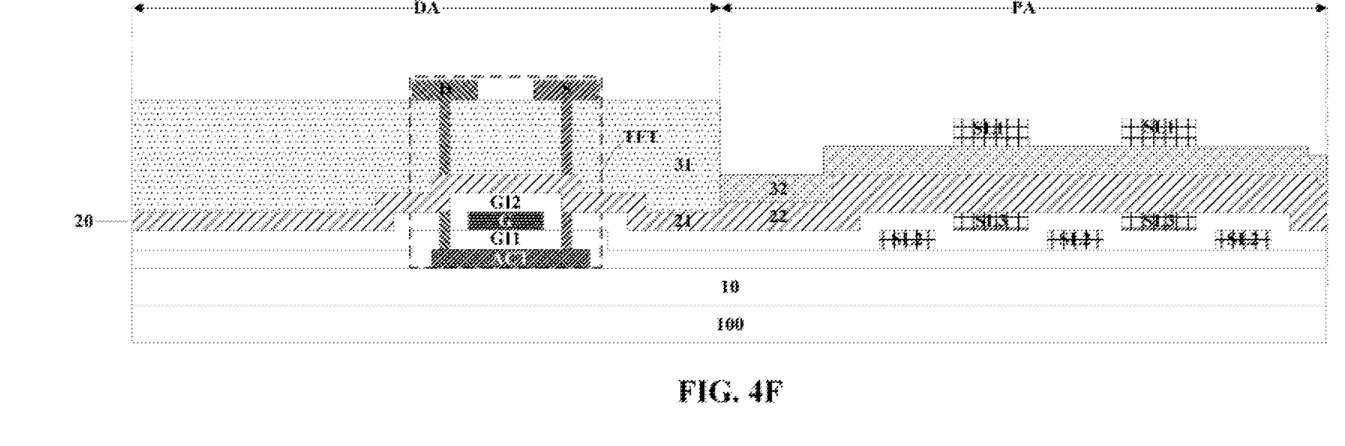

Referring to FIG. 4F, a source electrode S and a drain electrode D are formed to extend through the plurality of second vias v2 to connect to the active layer ACT, thereby forming a plurality of thin film transistors TFT. Optionally, a plurality of first signal lines SL1 and the source electrode S and the drain electrode D are formed in a same layer using a same material in a same patterning process using a same mask plate. The plurality of first signal lines SL1 are formed in the peripheral area PA and on a side of the inorganic insulating layer 32 away from the flexible base substrate 10.

Figure 4G:
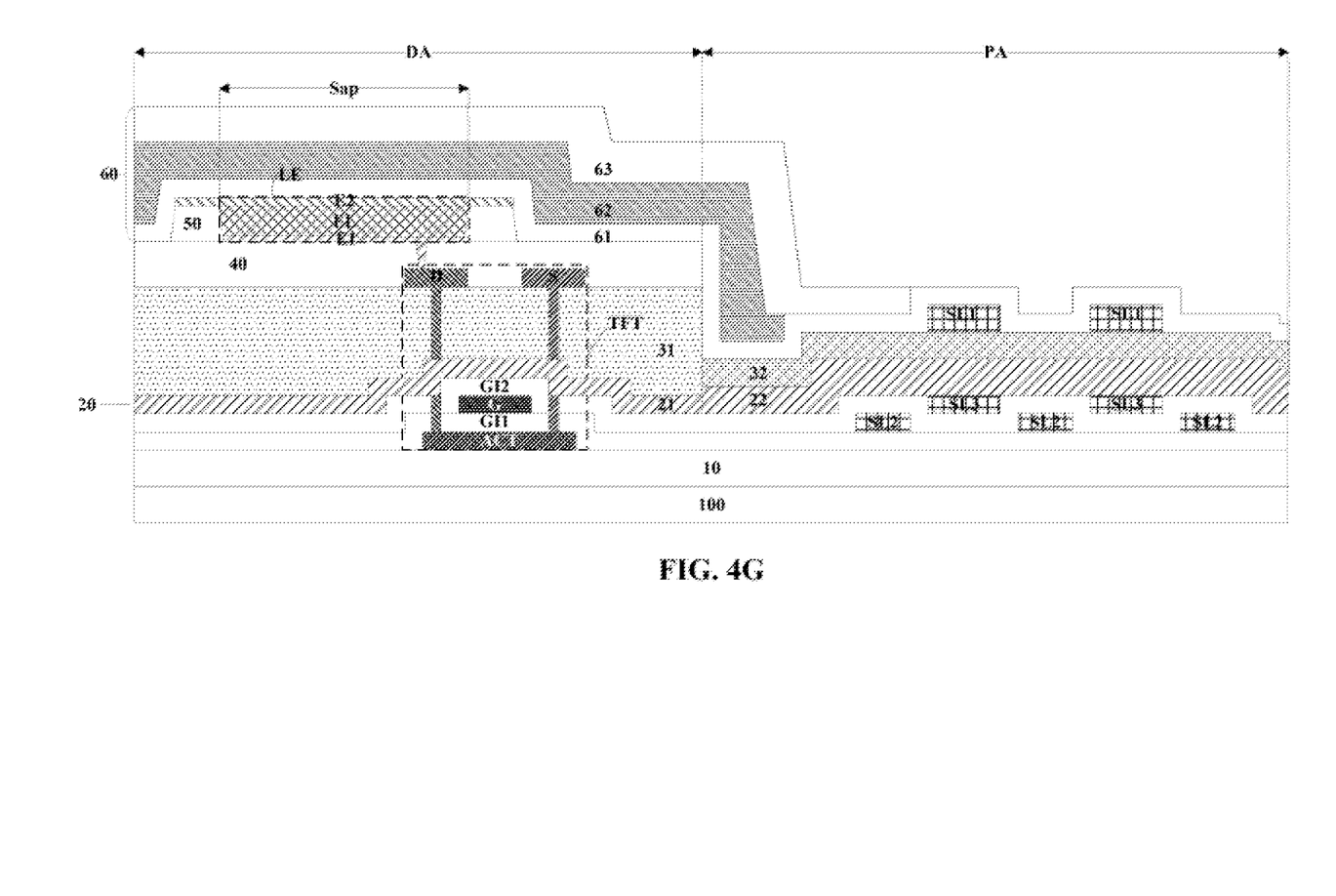

Referring to FIG. 4G, subsequently, a plurality of light emitting elements LE are formed, and an encapsulating layer 60 is formed to encapsulate the plurality of light emitting elements LE.

Referring to FIG. 3, the support substrate 100 is subsequently removed, thereby forming the array substrate.

In another aspect, the present disclosure provider a display apparatus including an array substrate described herein or fabricated by a method described herein, and one or more integrated circuits connected to the array substrate. Optionally, the display apparatus includes a display pond. Optionally, the display panel includes the array substrate described herein or fabricated by a method described herein, and a counter substrate. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly. Ute foregoing description should be regarded as illustrative rather than restrictive. Obviously, many modifications and variations will be apparent, to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention is defined by the following claims. Moreover, no element and component in the present disclosure is intended to be dedicated to the public regardless of whether the element or component is explicitly recited in the following claims.

What is claimed is:

1. An array substrate having a display area and a peripheral area, comprising:
   a flexible base substrate;
   a buffer layer on the flexible base substrate and continuously extending from the display area into the peripheral area, comprising a first portion substantially extending throughout the display area and a second portion in the peripheral area, the first portion and the second portion being parts of an integral layer;
   an organic insulating layer substantially extending throughout but limited in the display area and on a side of the buffer layer away from the flexible base substrate;
   an inorganic insulating layer limited in the peripheral area and on a side of the buffer layer away from the flexible base substrate;
   a planarization layer on a side of the organic insulating layer away from the buffer layer; and
   a plurality of light emitting elements on a side of the planarization layer away from the organic insulating layer.

2. The array substrate of claim 1, further comprising a plurality of thin film transistors on the flexible base substrate;
   wherein a respective one of the plurality of thin film transistors comprises a gate electrode, an active layer, a source electrode, and a drain electrode; and
   the buffer layer is on a side of the gate electrode and the active layer away from the flexible base substrate.

3. The array substrate of claim 2, wherein the source electrode and the drain electrode are on a side of the organic insulating layer away from the flexible base substrate;
   the source electrode extends through the organic insulating layer and the buffer layer to electrically connect with the active layer; and
   the drain electrode extends through the organic insulating layer and the buffer layer to electrically connect with the active layer.

4. The array substrate of claim 3, further comprising a plurality of first signal lines in the peripheral area and on a side of the inorganic insulating layer away from the flexible base substrate;
   wherein the plurality of first signal lines, the source electrode, and the drain electrode are in a same layer and comprise a same material.

5. The array substrate of claim 4, further comprising a plurality of second signal lines in the peripheral area and on a side of the buffer layer closer to the flexible base substrate;
   wherein the plurality of second signal lines and the gate electrode are in a same layer and comprise a same material; and
   the plurality of first signal lines are insulated from the plurality of second signal lines by the inorganic insulating layer and the buffer layer.

6. The array substrate of claim 4, wherein the source electrode is in direct contact with the organic insulating layer;
the drain electrode is in direct contact with the organic insulating layer; and
the plurality of first signal lines are in direct contact with the inorganic insulating layer.

7. The array substrate of claim 1 wherein the first portion has a thickness less than a thickness of the second portion.

8. The array substrate of claim 1 wherein the organic insulating layer is in direct contact with the buffer layer; and
the inorganic insulating layer is in direct contact with the buffer layer.

9. The array substrate of claim 1 wherein the buffer layer comprises silicon oxide ($SiO_x$, $0<x\leq 2$); and
the inorganic insulating layer comprises silicon nitride ($SiN_y$, $0<y\leq 4/3$).

10. A display apparatus, comprising the array substrate of claim 1, and one or more integrated circuits connected to the array substrate.

11. A method of fabricating an array substrate having a display area and a peripheral area, comprising:
forming a buffer layer on a flexible base substrate and continuously extending from the display area into the peripheral area, the buffer layer being formed as an integral layer comprising a first portion substantially extending throughout the display area and a second portion in the peripheral area;
forming an organic insulating layer substantially extending throughout the display area and on a side of the buffer layer away from the flexible base substrate, the organic insulating layer being formed to be limited in the display area;
forming an inorganic insulating layer on a side of the buffer layer away from the flexible base substrate, the inorganic insulating layer being formed to be limited in the peripheral area;
forming a planarization layer on a side of the organic insulating layer away from the buffer layer; and
forming a plurality of light emitting elements on a side of the planarization layer away from the organic insulating layer.

12. The method of claim 11, wherein forming the buffer layer comprises:
forming a buffer material layer on the flexible base substrate and continuously extending from the display area into the peripheral area;
forming an inorganic insulating material layer on a side of the buffer material layer away from the flexible base substrate and continuously extending from the display area into the peripheral area; and
annealing the buffer material layer and the inorganic insulating material layer.

13. The method of claim 12, subsequent to annealing the buffer material layer and the inorganic insulating material layer, further comprising:
removing the inorganic insulating material layer in the display area while maintaining the inorganic insulating material layer in the peripheral area thereby forming the inorganic insulating layer in the peripheral area; and
reducing a thickness of the buffer material layer in the display area, thereby forming the buffer layer comprising the first portion substantially extending throughout the display area and the second portion in the peripheral area;
wherein the first portion has a thickness less than a thickness of the second portion; and
removing the inorganic insulating material layer in the display area and reducing the thickness of the buffer material layer in the display area are performed in a same patterning process using a same etchant.

14. The method of claim 13, prior to forming the buffer layer, the organic insulating layer, and the inorganic insulating layer, further comprising forming a plurality of thin film transistors on the flexible base substrate;
wherein a respective one of the plurality of thin film transistors is formed to comprise a gate electrode, an active layer, a source electrode, and a drain electrode; and
the buffer layer is formed on a side of the gate electrode and the active layer away from the flexible base substrate.

15. The method of claim 14, subsequent to forming the buffer layer and the inorganic insulating layer, further comprising forming an organic insulating material layer on a side of the buffer layer and the inorganic insulating layer away from the flexible base substrate; and
patterning the organic insulating material layer to remove a portion of the organic insulating material layer in the peripheral area and forming a first via and a second via extending through the organic insulating material layer in the display area, thereby forming the organic insulating layer in the display area.

16. The method of claim 15, subsequent to forming the organic insulating layer in the display area, further comprising:
forming a protective layer in the peripheral area to protect the inorganic insulating layer and the buffer layer in the peripheral area; and
etching the buffer layer and a gate insulating layer underneath the first via and the second via respectively to expose a source electrode contact region and a drain electrode contact region of the active layer.

17. The method of claim 16, further comprising:
removing the protective layer in the peripheral area; and
cleaning the source electrode contact region and the drain electrode contact region using a cleansing agent.

18. The method of claim 17, wherein the cleansing agent comprises hydrogen fluoride.

19. The method of claim 17, further comprising forming a source electrode and a drain electrode on a side of the organic insulating layer away from the flexible base substrate, the source electrode extending through the first via to connect to the source electrode contact region, the drain electrode extending through the second via to connect to the drain electrode contact region.

20. The method of claim 19, further comprising forming a plurality of first signal lines in the peripheral area and on a side of the inorganic insulating layer away from the flexible base substrate; and
forming a plurality of second signal lines in the peripheral area and on a side of the buffer layer closer to the flexible base substrate;
wherein the plurality of first signal lines, the source electrode, and the drain electrode are formed in a same layer using a same material in a same patterning process using a same mask plate; and
the plurality of second signal lines and the gate electrode are formed in a same layer using a same material in a same patterning process using a same mask plate.

* * * * *